United States Patent [19]
Yagi et al.

[11] Patent Number: 5,686,353
[45] Date of Patent: Nov. 11, 1997

[54] SEMICONDUCTOR DEVICE AND MANUFACTURING METHOD THEREOF

[75] Inventors: Yoshihiko Yagi, Ashiya; Kazushi Higashi, Kadoma; Norihito Tsukahara, Kyoto; Koichi Kumagai, Ikoma; Takahiro Yonezawa, Neyagawa, all of Japan

[73] Assignee: Matsushita Electric Industrial Co., Ltd., Osaka, Japan

[21] Appl. No.: 576,160

[22] Filed: Dec. 21, 1995

[30] Foreign Application Priority Data

Dec. 26, 1994 [JP] Japan ............... 6-322032
Jan. 20, 1995 [JP] Japan ............... 7-007523
Jan. 25, 1995 [JP] Japan ............... 7-009401

[51] Int. Cl.⁶ ............................................. H01L 21/44
[52] U.S. Cl. ................. 437/183; 437/187; 437/203; 437/209
[58] Field of Search .................. 437/8, 203, 183, 437/187, 204, 209

[56] References Cited

U.S. PATENT DOCUMENTS 4,784,972  11/1988  Hatada ........................... 437/183
5,014,111   5/1991  Tsuda et al. .................... 437/183
5,071,787  12/1991  Mori et al. ..................... 437/183
5,124,277   6/1992  Tsumura ......................... 437/183
5,289,631   3/1994  Koopman et al. .................. 437/8
5,306,664   4/1994  Sakura .......................... 437/183
5,510,758   4/1996  Fujita et al. ................... 257/778
5,514,912   5/1996  Ogashiwa ........................ 437/183

Primary Examiner—Kevin Picardat
Attorney, Agent, or Firm—Ratner & Prestia

[57] ABSTRACT

An electrode terminal (5) provided on a surface of a semiconductor chip (4) has a square shape in plane view. Further, the projecting apex portion (8a) of a bump (8) provided on the electrode terminal (5) orients to a corner portion (5a) of the electrode terminal (5). Hereupon, a gold ball (2a) formed by melting the lower end portion of a gold wire (2) supplied through a capillary (1) is joined to the electrode terminal (5), and then the capillary (1) is moved in the direction of a diagonal line of the square electrode (5). Thus, the main portion of the gold wire (2) is separated from the gold ball (2a) so that the bump (8) is formed.

12 Claims, 12 Drawing Sheets ns of the device, more particularly, to a flip-chip type semiconductor device which is joined to a circuit substrate through its bumps using face down bonding technique or the like, each of the bumps being provided on corresponding one of electrode terminals of the device which acts as a pad for outward exposing an electrode, and also to a manufacturing method of the semiconductor device. Further, the present invention relates to a method of joining the semiconductor device to the circuit substrate in such a manner that each of the electrode terminals of the semiconductor device is electrically connected to corresponding one of electrodes of the circuit substrate, in a manufacturing process of various electronic apparatus.

DESCRIPTION OF THE PRIOR ART

In a manufacturing process of a flip-chip type semiconductor device (integrated circuit device), in general, a bump (projecting electrode) is formed in accordance with a technique as shown in FIG. 19. Namely, high voltage is applied between a torch electrode 3 and a gold wire 2 supplied through a capillary 1 of a bonding tool so that the lower end portion of the gold wire 2 melts to form a spherical gold ball 2a at the lower end portion. Then, the gold ball 2a is joined onto a square electrode terminal 5 arranged on a surface of a semiconductor chip 4 (IC chip) by means of thermocompression bonding technique or ultrasonic bonding technique so that a bump 6 is formed.

However, according to such a conventional bump forming technique, immediately after the gold ball 2a has been joined to the electrode terminal 5, the lower end portion of the gold wire 2 is separated from the gold ball 2a so as to bend toward the bump 6, as indicated by a two-dot chain line 2b. The bending direction of the gold wire 2 is determined by the moving direction of the capillary 1. Hereupon, the bending direction in relation to the torch electrode 3 is not fixed, and then it may vary according to the position or direction of a bump 6 which will be formed in the following step. Therefore, the spark interval between the lower end of the gold wire 2 and the torch electrode 3 is not uniform so that the spark current is not uniform. Thus, there is such a problem that it is difficult to form a plurality of bumps 6 at a predetermined position without a shape irregularity or the like. Further, when the bump 6 protrudes out of the electrode terminal area, there occurs such a problem that a short circuit or a incorrect connection is easily caused between the electrodes.

Further, in a manufacturing process of the flip-chip type semiconductor device S, there is required a leveling treatment for adjusting the height of each of the bumps 6 provided on the surface of the semiconductor chip 4, and then it is required that the leveling treatment is performed with high accuracy.

As shown in FIG. 20, according to a conventional leveling treatment technique, at first the semiconductor chip 4 having the bumps 6 on its front surface is disposed on a flat leveling stage 11 in such a manner that the front surface of the semiconductor chip 4 orients upward. In the condition, a pressing plate 12 moves downward so that the bumps 6 is pressed by a flat and smooth lower surface of the pressing plate 12. In consequence, substantially, a head portion of each of the bumps 6 is transformed so that the height of each of the bumps 6 becomes uniform.

As mentioned above, though the bumps 6 are transformed during the leveling treatment, the transformed degree of each of the bumps 6 is not completely uniform, namely it has an individual difference. Therefore, in this step, it is necessary to examine whether the leveling treatment is sufficient or not, or whether an obstruction such as a short circuit or the like is caused or not. However, according to a conventional examination technique which depends on a visual observation, there is such a problem that an accurate and efficient examination can not be expected.

Further, as the semiconductor chip is larger, the number of the required bumps becomes larger so that the pressing load (force) which is required to perform the leveling treatment becomes larger. Therefore, there occurs such a problem that it is required to prepare an expensive large scale pressing apparatus.

On the other hand, in a manufacturing process of various electronic apparatus, each of a plurality of electrode of the semiconductor device S is electrically connected to corresponding one of a plurality of electrodes of a circuit substrate in a lump so that the semiconductor device S is joined to the circuit substrate. Hereinafter, a conventional method of joining the semiconductor device S to the circuit substrate in accordance with FIGS. 21 to 24.

Namely, as shown in FIG. 21, in the semiconductor device S, on each of the electrode terminals 5 of the semiconductor chip 4, the bump 6 (projecting electrode) is formed using gold wire, solder wire or the like by means of ball bonding technique. Since it is difficult to adjust the height of each of the bumps 6 in the bump forming step, it is unavoidable that each of the bumps 6 has a different height.

Thus, as shown in FIG. 22, in order to correct height irregularity of each of the bumps 6 before the joining step, at first the semiconductor device S is pressed downward by a pressing member 13, and then the bumps 6 of the semiconductor device S are pressed against a surface of a flat plate 14. In consequence, the apex portion of each of the bumps 6 is transformed so that the height of each bump 6 is uniformed.

Then, as shown in FIG. 23, the flattened apex portions of the bumps 6 of the semiconductor device S are pushed against a surface of a flat transfer plate 16 on which electrically conductive adhesive 15 with predetermined thickness is applied so that the electrically conductive adhesive 15 is transferred to the apex portions of the bumps 6.

Further, as shown in FIG. 24, the semiconductor device S is disposed on a circuit substrate 17 in such a manner that the apex portion of each of the bumps 6 on which the electrically conductive adhesive 15 is applied, is located on corresponding one of electrodes 18 provided on the circuit substrate 17, and then the semiconductor device S is joined to the circuit substrate 17.

According to the above-mentioned conventional joining technique, the height of each of the bumps 6 is uniformed, namely the height irregularity is corrected. Hereupon, the thickness of the electrically conductive adhesive 15 transferred to the apex portion of each of the bumps 6 is as much as 10 μm. Therefore, the thickness (height) irregularity of each of the electrodes 18 of the circuit substrate 17 to which the semiconductor device S is joined, must be absorbed by the electrically conductive adhesive 15 of about 10 μm thickness which is transferred to the apex portion of each of the bumps 6. In consequence, when the circuit substrate 17 has a warp having deviation greater than 10 µm or the thickness irregularity among the electrodes 18 of the circuit substrate 17 is greater than 10 µm, there occurs such a problem that the semiconductor device S cannot be suitably joined to the circuit substrate 17.

Moreover, as shown in FIG. 24, since the distance between the apex portion of each of the bumps 6 of the semiconductor device S and the corresponding electrode 18 of the circuit substrate 17 is not uniform, there is also such a problem that the bonding strength between semiconductor device S and the circuit substrate 17 may be insufficient, and further there is such a problem that the connecting resistance value of each of the bumps 6 may be uniform. For example, there may be formed a bump 6 having connecting resistance of 30 mΩ/bump which is standard resistance value, or there may be formed a bump 6 having connecting resistance of 100 mΩ/bump.

SUMMARY OF THE INVENTION

The present invention has been developed to solve the above-mentioned conventional problems, and has an object of providing a semiconductor device (integrated circuit device) in which there is caused no short circuit among its bumps (electrodes), and a manufacturing method of the semiconductor device, in which the semiconductor device is formed without bump shape irregularity, even if the lower end portion of a gold wire which is a material of the bumps, is bent.

Further, the present invention has another object of providing a manufacturing method of the semiconductor device, in which the mechanical or/and electrical characteristic of the bumps transformed by leveling treatment can be grasped accurately and efficiently. Still further, the present invention has another object of providing a manufacturing method of the semiconductor device, in which the bumps can be transformed with a high accuracy and also the leveling treatment can be easily performed for the semiconductor device having many bumps.

Moreover, the present invention has another object of providing a method of joining the semiconductor device to a circuit substrate, in which a plurality of bumps of the semiconductor device can be connected to a plurality of electrodes of the circuit substrate in a lump with high reliability.

Thus, according to a first aspect of the present invention, which is developed to achieve the above-mentioned objects, there is provided a semiconductor device (integrated circuit device) comprising, an electrode terminal disposed on a surface of a semiconductor chip (IC chip), the electrode terminal having a square shape in plane view, and a bump disposed on the electrode terminal, a projecting apex portion of the bump orienting to a corner portion of the electrode terminal.

In the above-mentioned semiconductor device, since the projecting apex portion of the bump disposed on the electrode terminal which has a square shape in plane view, orients to the corner portion of the square electrode terminal, permissible positional deviation of the bump becomes larger. Namely, the area in which the bump can be disposed is the square shape surface of the electrode terminal. Then, each of four corner portions of the electrode terminal is located on one of diagonal lines of the square, in which the distance in the radial direction from the center of the electrode terminal to the periphery thereof is maximum. Hereupon, since the projecting apex portion of the bump orients to the corner portion, it is less feared that the bump contacts to the adjacent electrode terminal, even if the position of the bump is a little slipped out of the center of the electrode terminal, or even if the bump is formed with a little excessive size. Thus, according to the semiconductor device, a short circuit is not caused between bumps, even if each of the bumps has a little irregularity of position or shape. Further, even if the lower end portion of a gold wire which is a material of the bump bends, the bump is formed with an uniform shape.

Further, according to a second aspect of the present invention, there is provided a manufacturing method of a semiconductor device (integrated circuit device) including the step of forming a bump on a square electrode terminal disposed on a surface of a semiconductor chip (IC chip) using a gold wire as a material of the bump, the gold wire being supplied through a capillary, the electrode terminal having a square shape in plane view, and the bump forming step comprising the steps of, joining a gold ball onto the electrode terminal, the gold ball being formed by melting an end portion of the gold wire, and moving the capillary in a direction of a diagonal line of the square electrode terminal so as to separate a main portion of the gold wire from the gold ball.

In the above-mentioned manufacturing method of the semiconductor device, after the gold ball has been joined to the electrode terminal, the capillary is moved in the direction of the diagonal line of the square electrode terminal. Consequently, since the gold wire is separated from the bump (gold ball) along the diagonal line, a projecting apex portion of the formed bump orients to a corner portion of the square electrode terminal.

Furthermore, according to a third aspect of the present invention, there is provided a manufacturing method of a semiconductor device including the step of forming a bump on each of first and second electrode terminals disposed on a surface of a semiconductor chip using a gold wire as a material of the bump, the gold wire being supplied through a capillary, and the bump forming step comprising the steps of, joining a gold ball onto the first electrode terminal located directly under the capillary so as to form a first bump, the gold ball being formed by melting an end portion of the gold wire under a predetermined spark condition, moving a holding pedestal holding the semiconductor chip so as to dispose the second electrode terminal directly under the capillary, and joining another gold ball onto the second electrode terminal so as to form a second bump, the gold ball being formed by melting the end portion of the gold wire under a spark condition as same as the spark condition of the first bump.

In the above-mentioned manufacturing method of the semiconductor device, after the first bump has been formed, the semiconductor chip can be moved with the holding pedestal. Hereupon, even if the lower end portion of the gold wire bends in a certain direction, the gold ball needed for forming the second bump is formed under the spark condition as same as the spark condition in the case of forming the first bump, by fixing the spark interval between the gold wire and a torch electrode at a constant value in consideration of the bend and then moving the semiconductor chip so as to change the direction or/and position thereof preferably. Therefore, each of the bumps is formed without shape irregularity.

Moreover, according to a fourth aspect of the present invention, there is provided a manufacturing method of a semiconductor device including the step of forming a bump on each of first and second electrode terminals disposed on a surface of a semiconductor chip using a gold wire as a material of the bump, the gold wire being supplied through a capillary, and the bump forming step comprising the steps of, joining a gold ball onto the first electrode terminal located directly under the capillary so as to form a first bump, the gold ball being formed by melting an end portion of the gold wire under a predetermined spark condition using a torch electrode, and moving the torch electrode around the capillary so as to enable to melt the end portion of the gold wire under a spark condition as same as the spark condition of the first bump, and then joining another gold ball onto the second electrode terminal so as to form a second bump, the gold ball being formed by melting the end portion of the gold wire under the spark condition.

In the above-mentioned manufacturing method of the semiconductor device, after the first bump has been formed, the torch electrode can be moved around the capillary. Hereupon, even if the end portion of the gold wire bends in a certain direction, the torch electrode can be preferably moved in response to the direction of the bend. Therefore, the spark current is uniformed so that each of the bumps may be formed without shape irregularity.

In addition, according to a fifth aspect of the present invention there is provided a manufacturing method of a semiconductor device comprising, holding a semiconductor chip having a plurality of bumps on a surface thereof at another surface opposite to the surface by means of a semiconductor holder, and partially or entirely pressing the bumps against a leveling stage so as to uniform height of each of the bumps, and simultaneously performing a functional test (for example, a continuity test of the bumps, an electrical test of the IC etc.) of the semiconductor chip.

In the above-mentioned manufacturing method of the semiconductor device, during the leveling treatment step for pressing the bumps against the leveling stage so as to uniform the height of each of the bumps, the functional test of the semiconductor chip is performed together with the other treatment in the step. Therefore, an accurate functional test can be efficiently performed, and also excess or lack of degree of the leveling treatment can be corrected in accordance with the result of the functional test.

Further, according to a sixth aspect of the present invention, preferably, the functional test of the semiconductor chip is performed by means of an electrode for functional test use which is provided at a portion of the leveling stage, the portion being contacted to one of the bumps. Still further, according to a seventh aspect of the present invention, preferably, the functional test of the semiconductor chip is performed by means of each of electrodes for functional test use which is provided for corresponding one of the bumps, each of the electrodes including two electrical contacts adjacent each other.

Moreover, according to a eighth aspect of the present invention, preferably, at least one of the semiconductor holder and the leveling stage is heated when the bumps are pressed against the leveling stage. When at least one of the semiconductor holder and the leveling stage is heated as mentioned above, the bumps soften during the leveling treatment. In consequence, the accuracy of the leveling treatment is improved, and then many bumps are treated in a lump with a relatively smaller pressing load (force) by one leveling treatment.

In addition, according to a ninth aspect of the present invention, there is provided a manufacturing method of a semiconductor device which is joined to a circuit substrate in such a manner that a bump disposed on each of electrode terminals provided on the semiconductor device is connected to corresponding one of electrodes of the circuit substrate in which an electrical circuit is formed, the manufacturing method comprising the steps of, positioning the semiconductor device in relation to the circuit substrate in such a manner that each of the bumps is located above corresponding one of the electrodes of the circuit substrate respectively, and pressing the semiconductor device against the circuit substrate so as to transform an apex portion of each of the bumps, and thus adapting height of each of the bumps to actual height of corresponding one of the electrodes of the circuit substrate.

In the above-mentioned manufacturing method of the semiconductor device, the height of each of the bumps of the semiconductor device is adapted to the actual height of corresponding one of the electrodes of the circuit substrate with extreme stability and accuracy, even if each of the electrodes of the circuit substrate has irregularity of thickness, or even if the circuit substrate has a warp or an undulation.

Further, according to a tenth aspect of the present invention, a functional test of an electrical circuit in the semiconductor device is performed when the semiconductor device is pressed against the circuit substrate. Thus, according to the manufacturing method of the semiconductor, the functional test of the semiconductor device can be easily performed.

Moreover, according to a eleventh aspect of the present invention, the semiconductor device is heated when the semiconductor device is pressed against the circuit substrate. Thus, according to the manufacturing method of the semiconductor device, since the pressing step is performed with heating, in comparison with the manufacturing method according to the ninth aspect, the pressing force is reduced so that the pressing time is reduced.

Moreover, according to a twelfth aspect of the present invention, the semiconductor device manufactured by the method in accordance with any one of the ninth to eleventh aspects is joined to a circuit substrate in such a manner that a bump disposed on each of electrode terminals provided on the semiconductor device is connected to corresponding one of electrodes of the circuit substrate in which an electrical circuit is formed. Hereupon, the bumps of the semiconductor device is pushed against a surface of electrically conductive adhesive or cream-type solder applied on a surface of a flat plate so that the electrically conductive adhesive or the cream-type solder is transferred to the bumps. Then, the semiconductor device is positioned in relation to the circuit substrate in such a manner that each of the bumps to which the electrically conductive adhesive or the cream-type solder has been transferred, is disposed on corresponding one of the electrodes of the circuit substrate, respectively. And then, the semiconductor device is joined to the circuit substrate.

Thus, in the above-mentioned method for joining the semiconductor device to the circuit substrate, since the height of each of the bumps of the semiconductor device is adapted to the actual height of corresponding one of the electrodes of the circuit substrate and then the semiconductor device is joined to the circuit substrate, the same operations and effects as those of any one of the methods according to the ninth to eleventh aspects is obtained, and also an incorrect connection (open degradation) between each of the bumps and corresponding one of electrodes of the circuit substrate is not caused and further the connecting strength between the semiconductor device and the circuit substrate is improved. For example, the connecting resistance value is stabilized in a range of 20 to 30 mΩ, consequently the semiconductor device can be joined to the circuit substrate with extremely high stability and reliability.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENT

Hereinafter, several preferred embodiments of the present invention will be concretely described.

<The First Embodiment>

Hereinafter, the first embodiment of the present invention will be described with reference to the accompanying drawings.

Figure 1:
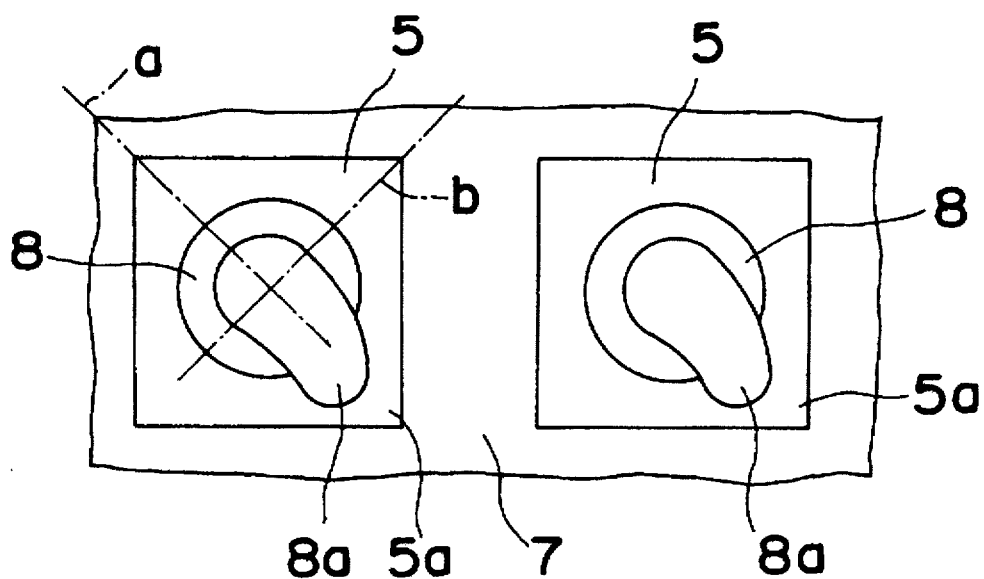
FIG. 1 is a plan view of a semiconductor device (integrated circuit device) with bumps according to the present invention illustrating a portion of the semiconductor device around the bumps.
Figure 2:
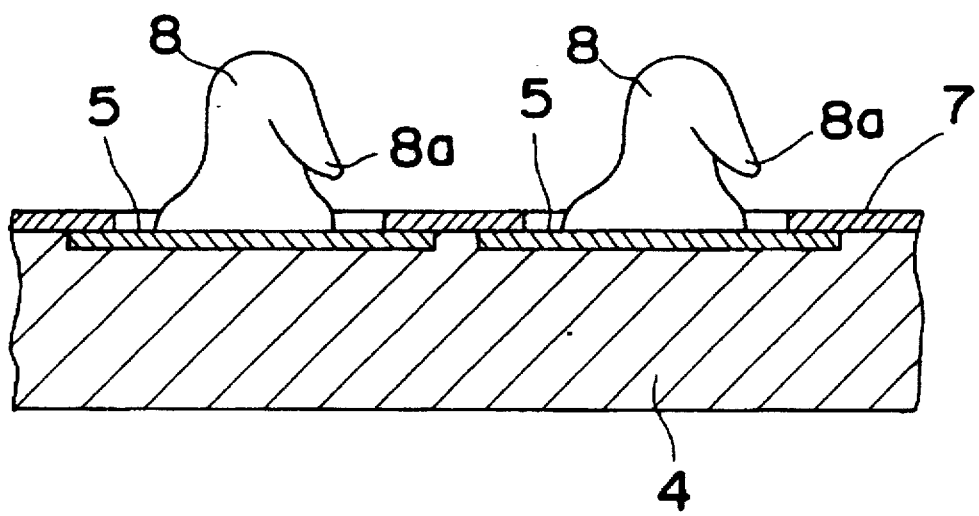
FIG. 2 is a partially sectional side view of the semiconductor device shown in FIG. 1.

As shown in FIGS. 1 and 2, in the first embodiment of the present invention, a plurality of electrode terminals 5 are outward exposed out of a surface insulating layer 7 of a semiconductor chip 4 (IC chip). Hereupon, each of the electrode terminals 5 has a shape of square in plane view.

Thus, the projecting apex portion 8a of a stud-type bump 8 provided on each of the electrode terminals 5 orients to a corner portion 5a of the electrode terminal 5. Hereupon, the length of a radial line from the center of the electrode terminal 5 to the periphery thereof is maximum when the radial line corresponds to a diagonal "a" or "b" which passes the opposite two corner portions. Therefore, even if each of the bumps 8 has a little irregularity of position or shape thereof, it hardly occurs such a matter that the bump 8 outward slips out of the electrode terminal 5. Consequently, it is less feared that the bump 8 on the electrode terminal 5 contacts to an adjacent electrode terminal 5 or to a bump 8 on the adjacent electrode terminal 5.

Figure 3:
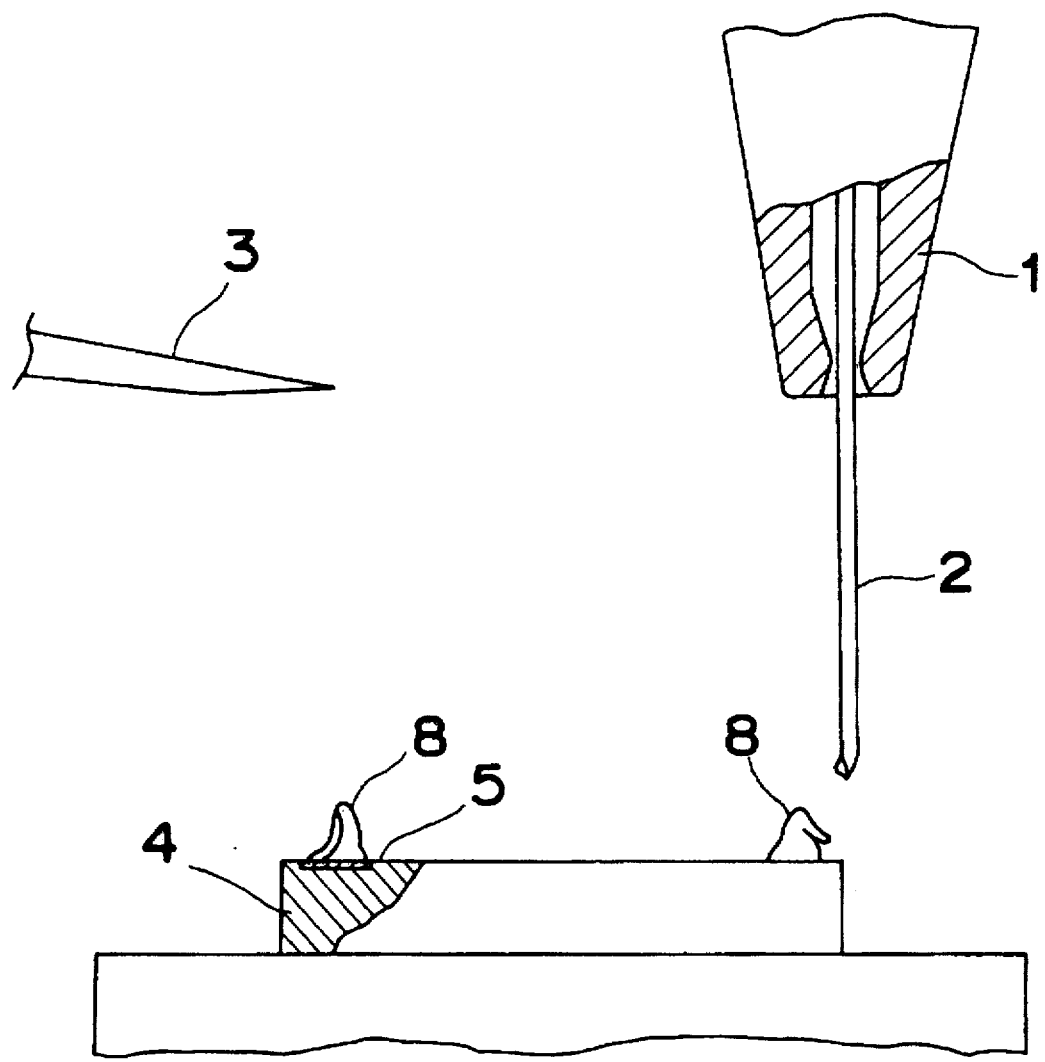
FIG. 3 is a partially sectional side view of an assembly composed of the semiconductor device and an apparatus for forming the bumps in a bump forming step.

As shown in FIG. 3, each of the bumps 8 is formed using a gold wire 2 as a material thereof. Namely, high spark voltage is applied between a torch electrode 3 and the gold wire 2 supplied through a capillary 1 of a bonding tool so that the lower end portion of the gold wire 2 melts so as to form a gold ball at the end portion, and then the gold ball is joined to the electrode terminal 5 by means of thermocompression bonding technique or ultrasonic bonding technique. Then, immediately after that, the capillary 1 is moved in the direction of the diagonal line "a" of the electrode terminal 5 so that the main portion of the gold wire 2 is separated from the gold ball (bump 8). In consequence, the projecting apex portion 8a of the bump 8 formed on the electrode terminal 5 orients to the corner portion 5a.

Figure 4:
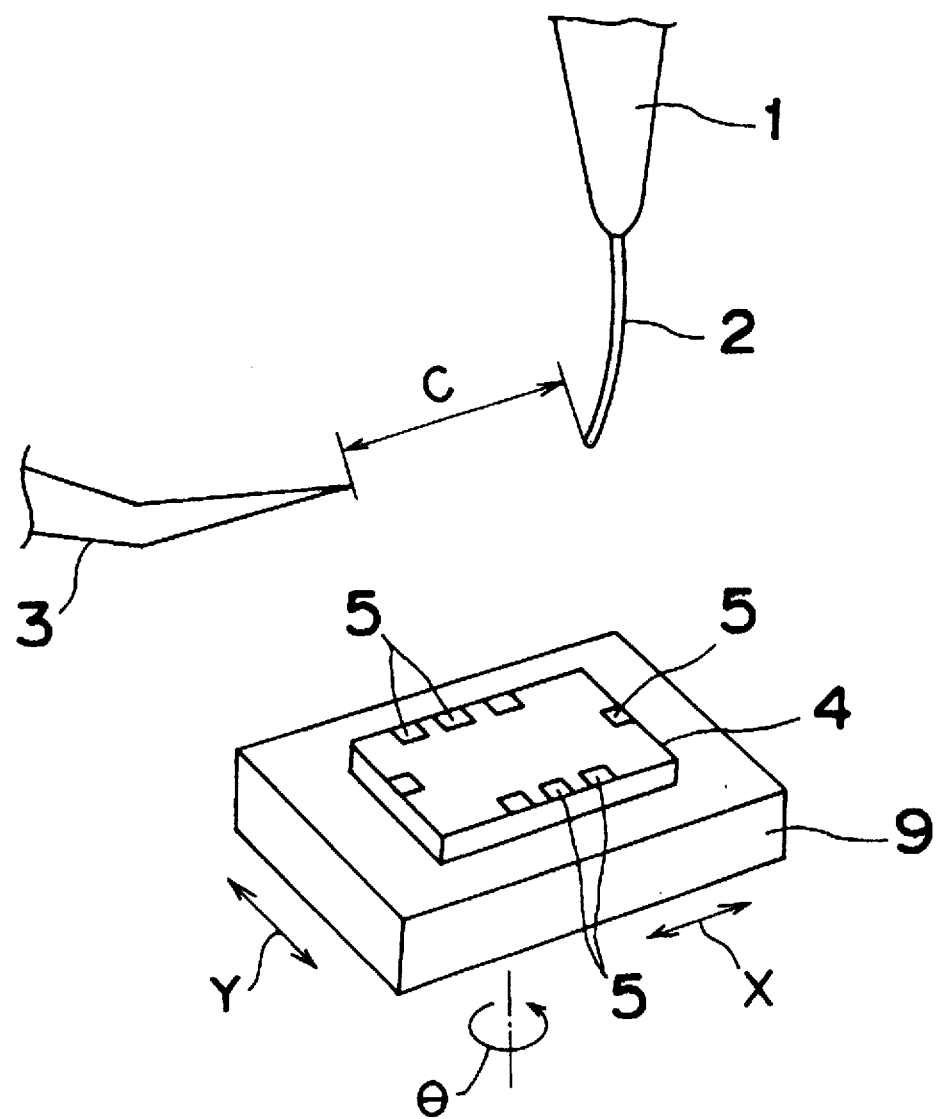
FIG. 4 is a perspective view of the assembly composed of the semiconductor device and the apparatus for forming the bumps in the bump forming step.

In an example shown in FIG. 4, the distance between the extreme end of the torch electrode 3 and the lower end of the gold wire 2 supplied through the capillary 1 is set at a predetermined spark interval "c". Further, the semiconductor chip 4 can be moved in the X-direction and the Y-direction and also can be rotated in the θ-direction by means of a holding pedestal 9. In this case, after a bump 8 has been formed on a electrode terminal 5 (the first electrode terminal) arranged along a side of the semiconductor chip 4, the semiconductor chip 4 is preferably moved and rotated. Then, a bump 8 is formed on a electrode terminal 5 (the second electrode terminal) arranged along another side of the semiconductor chip 4. Hereupon, the spark interval "c" may be fixed to a constant value in consideration with the bending direction and/or the bending degree of the gold wire 2. In consequence, the spark condition in time of forming the gold ball, and/or the direction or the shape of the formed bump 8 may be uniformed.

Figure 5:
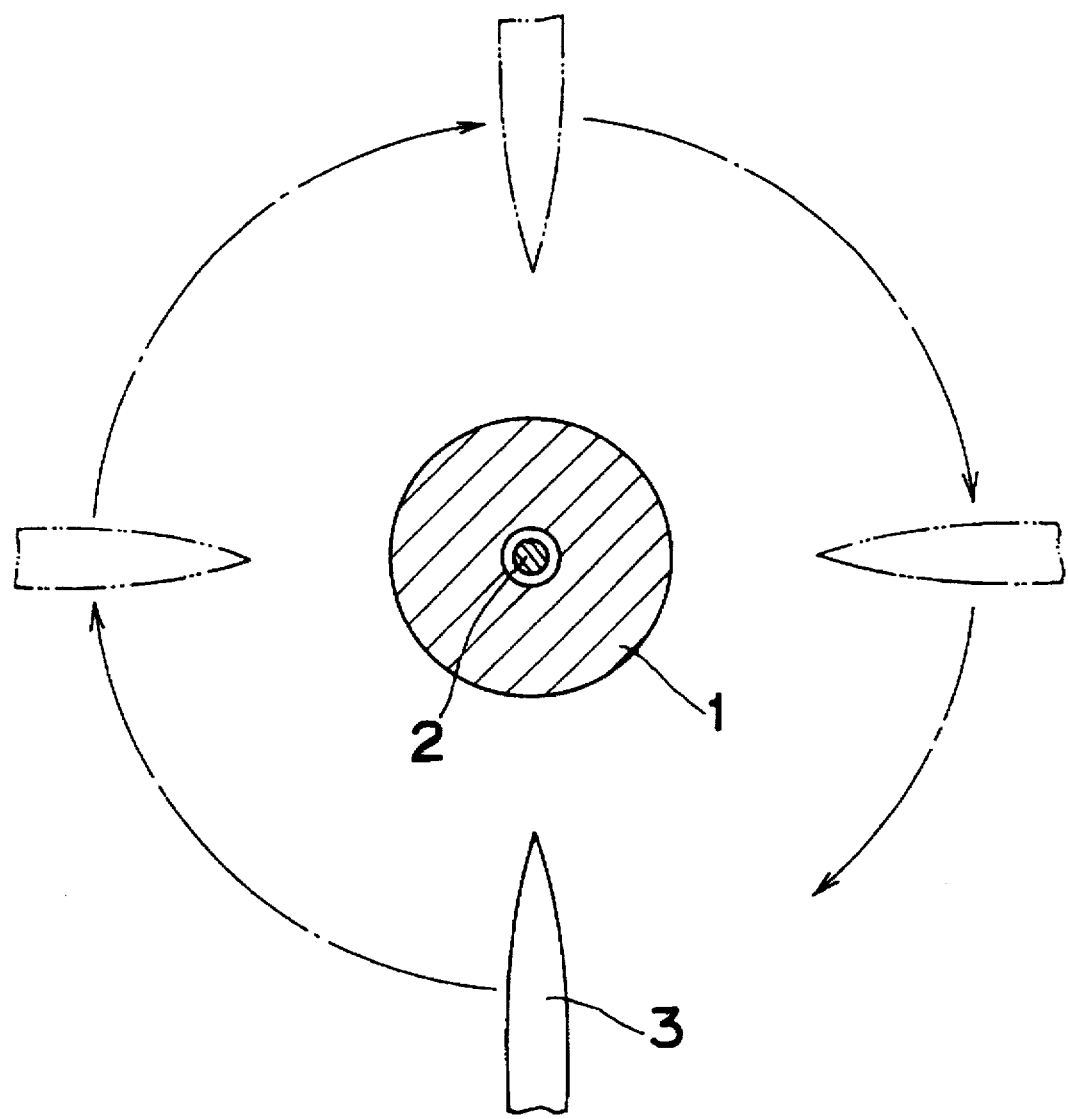
FIG. 5 is a schematic view of an assembly composed of a capillary and a torch electrode illustrating the positional relation between the both members.

In an example shown in FIG. 5, the torch electrode 3 can rotate around the capillary 1. In this case, since the torch electrode 3 is moved in response to the bending direction of the end portion of the gold wire 2 supplied through the capillary 1, the spark interval and the spark condition can be uniformed without the movement of the semiconductor chip 4.

Hereupon, each of the bumps 8 formed by the above-mentioned method is not restricted such a stud-type bump as shown in FIGS. 1 to 3. For example, each of the bumps 8 may be a ball-type bump.

<The Second Embodiment>

Hereinafter, the second embodiment of the present invention will be described with reference to the accompanying drawings.

Figure 6:
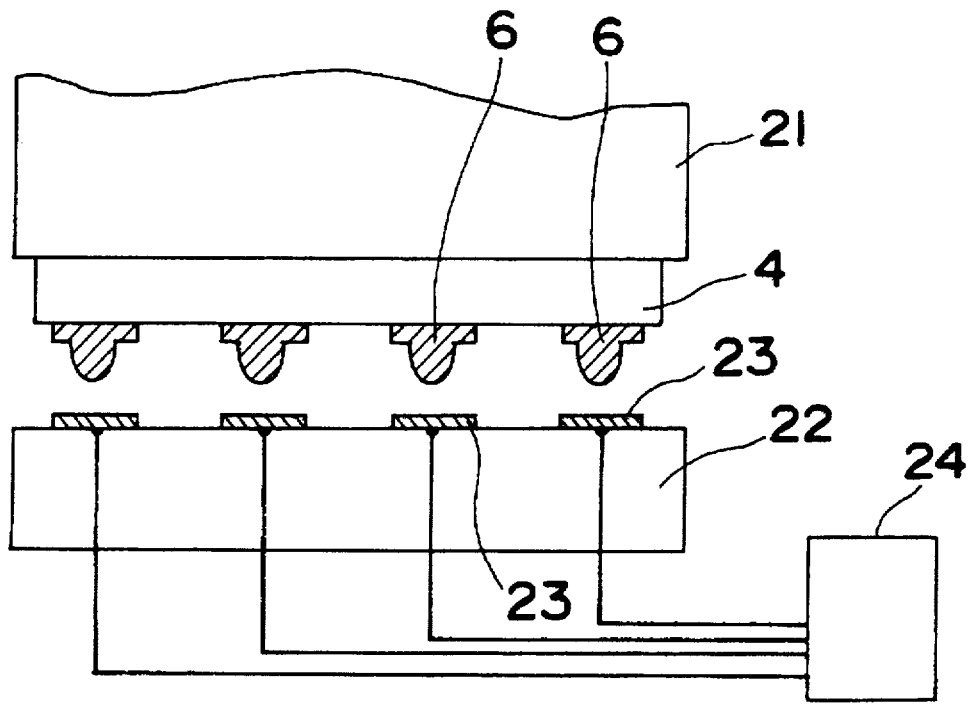
FIG. 6 is a side view of a leveling treatment apparatus with the semiconductor device according to the present invention in a state before a leveling treatment.

As shown in FIG. 6, a semiconductor chip 4 having a plurality of bumps 6 arranged on a front surface of the chip is held with attractive force (suction force) at a back surface of the chip by means of a semiconductor holder 21 having an attractive nozzle (suction nozzle). Each of the bumps 6, which is made of gold (Au) or the like, has a head portion of a spherical shape. Further, a leveling stage 22 disposed under the semiconductor holder 21 has an electrode 23 on each of portions of the stage to be contacted with the bumps 6 respectively, and then each of the electrodes 23 is connected to a tester 24.

Figure 7:
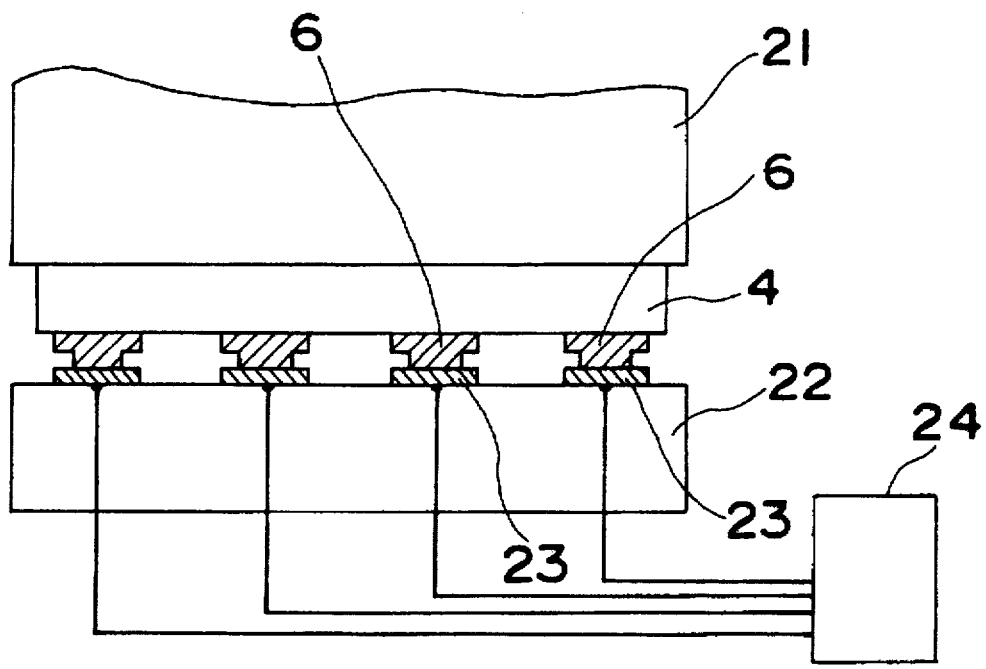
FIG. 7 is a side view of the leveling treatment apparatus with the semiconductor device according to the present invention in a state during the leveling treatment.

When the semiconductor holder 21 moves downward as shown in FIG. 7, each of the bumps 6 is pressed against corresponding one of the electrodes 23 so that a leveling treatment is performed to the bumps 6. At the same time, an internal circuit of the semiconductor chip 4 is electrically connected to the tester 24 through the electrodes 23. Thus, the tester 24 performs a functional examination for the semiconductor device. For example, the tester 24 examines whether an open short circuit is caused in the semiconductor side or not (continuity test for the bump) and also examines the action state of the semiconductor side (electrical test for the semiconductor device), and then indicates the result of the tests on an indicator. In consequence, excess or lack of the leveling treatment, faults of the bumps 6 and so on can be grasped in a moment during the leveling treatment.

In the above-mentioned embodiment, the electrodes 23 for the functional examination use are provided on the upper surface of the leveling stage 22. However, the electrodes 23 may be provided to the lower surface of the semiconductor holder 21. In this case, the semiconductor chip 4 must be disposed on the leveling stage 22 in such a manner that the front surface of the chip orients upward.

Figure 8:
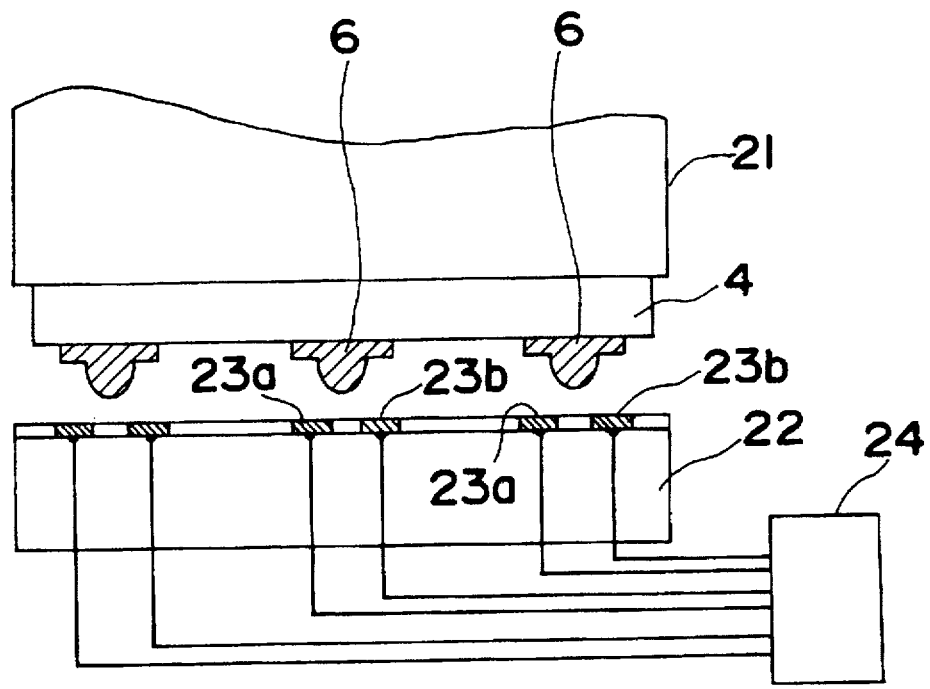
FIG. 8 is a side view of another leveling treatment apparatus with the semiconductor device according to the present invention in the state before the leveling treatment.
Figure 9:
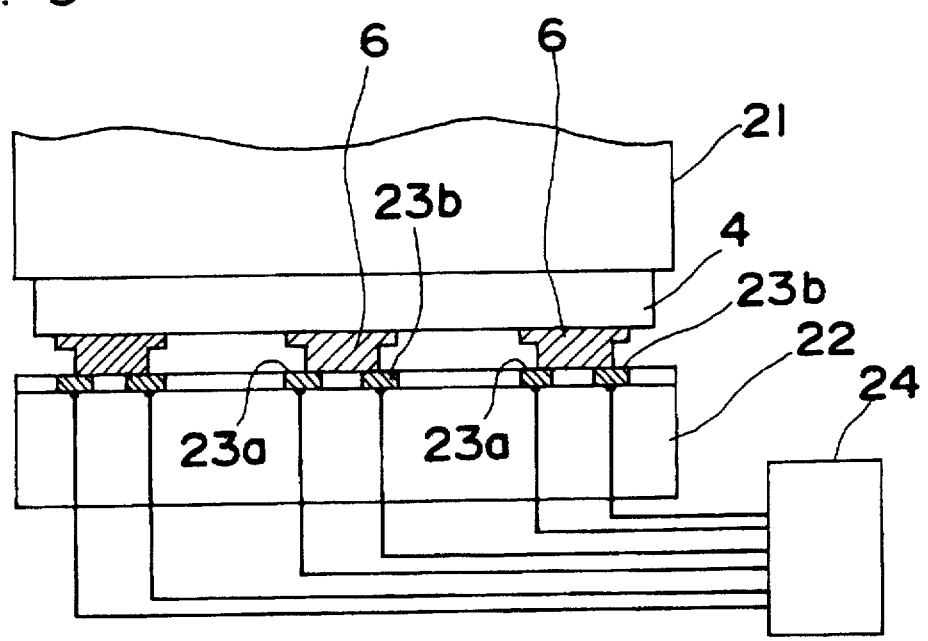
FIG. 9 is a side view of the leveling treatment apparatus with the semiconductor device according to the present invention in the state during the leveling treatment.

Each of the electrodes 23 for the functional examination use may be divided into two electrode members. In an example shown in FIGS. 8 and 9, a pair of electrode members are provided on portions of the leveling stage 22, each of the portions being to be contacted with the same bump 6. In other words, two electrical contacts 23a and 23b adjacent each other are provided to each of the bumps 6, each of the electrical contacts acting as an electrode for the functional examination use. In this case, since a mutual continuity test between a pair of electrical contacts 23a and 23b can be also performed, it can be more certainly examined whether each of predetermined bumps 6 actually exists or not.

Thus, when the mutual interval between a pair of electrical contacts 23a and 23b is set, for example, at a value of 40 μm, it can be examined whether the width of the head portion of the bump 6 is transformed with a degree greater than or equal to 40 μm or not.

Figure 10:
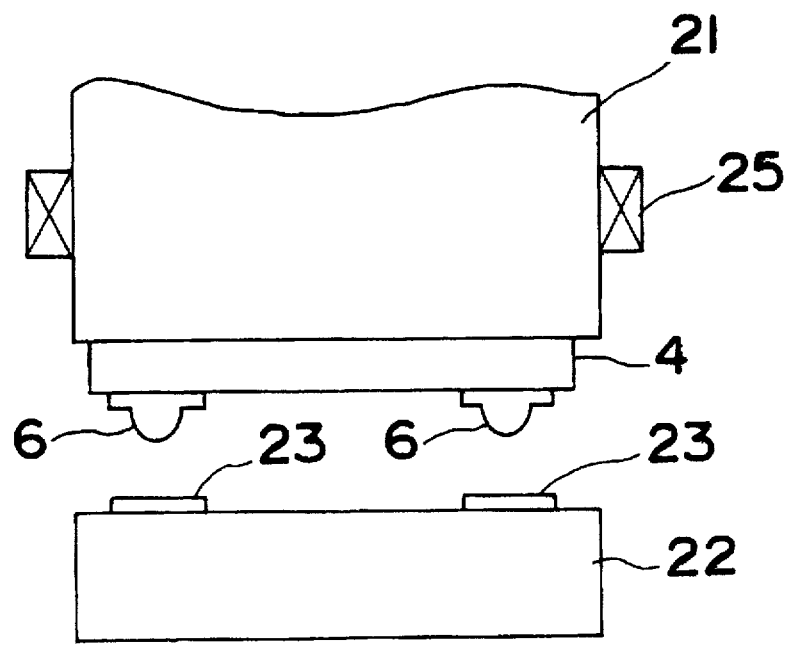
FIG. 10 is a side view of another leveling treatment apparatus with the semiconductor device according to the present invention.
Figure 11:
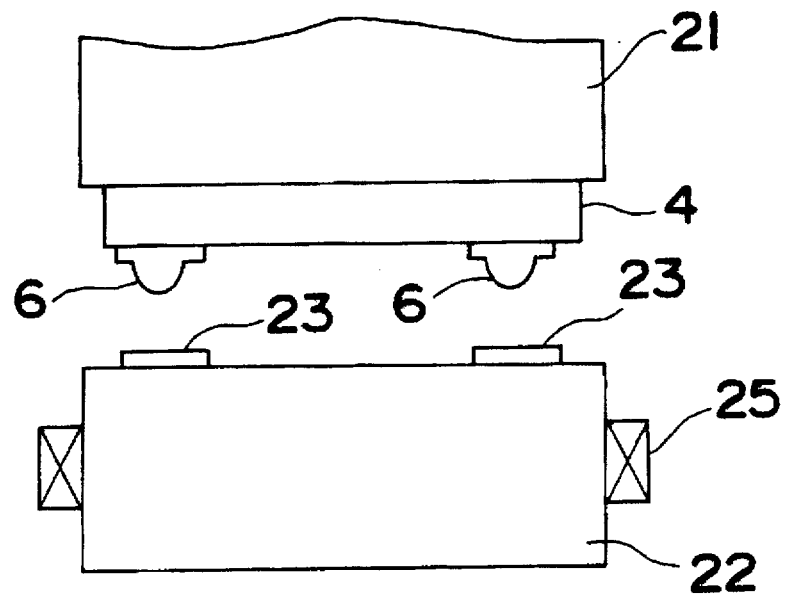
FIG. 11 is a side view of another leveling treatment apparatus with the semiconductor device according to the present invention.

In an example shown in FIG. 10, a heater 25 is provided to the semiconductor holder 21. On the other hand, in an example shown in FIG. 11, the heater 25 is provided to the leveling stage 22. When the heater 25 is provided as described above, the bumps 6 are softened during the leveling treatment by heating. In consequence, each of the bumps 6 is transformed with high accuracy, and then the pressing load (force) required for the leveling treatment is reduced.

For example, when the temperature of the bumps 6 is set at 150° C., the pressing load becomes ½ of that of normal temperature condition. Further, when the temperature of the bumps 6 is set at 300° C., the pressing load becomes ⅓ of that of normal temperature condition. Therefore, the output power of the pressing apparatus is reduced, and also there is reduced such fear that a crack is caused in the semiconductor chip 4.

<The Third Embodiment>

Hereinafter, the third embodiment of the present invention will be described with reference to the accompanying drawings.

Figure 12:
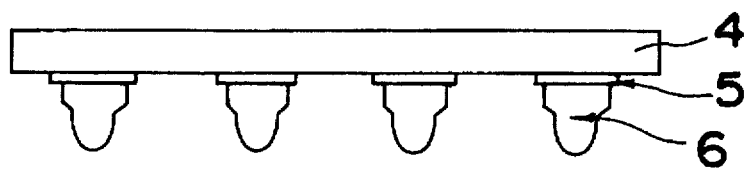
FIG. 12 is a side view of the semiconductor device with the bumps.

As shown in FIG. 12, on each of electrode terminals 5 of a semiconductor chip 4 of a semiconductor device SM, a bump 6 (projecting electrode) is formed using a gold wire, a solder wire or the like by means of ball bonding technique. Hereupon, it is difficult to uniform the height of each of the bumps 6 in the forming step of the bump 6 so that it is unavoidable that each of the bumps 6 has different height.

Figure 13:
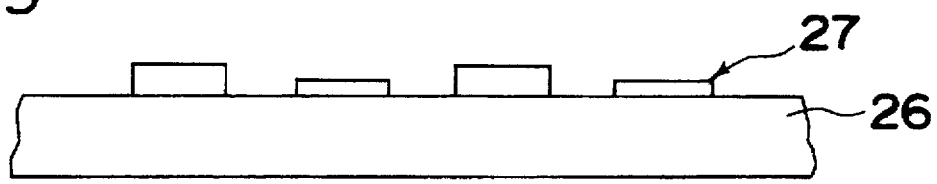
FIG. 13 is a side view of a circuit substrate with electrodes.

As shown in FIG. 13, it is probable that each of a plurality of electrodes 27 provided on a circuit substrate 26 to which the semiconductor device SM is joined, has thickness irregularity. As mentioned above, even if each of the electrodes 27 of the circuit substrate 26 has thickness irregularity, or even if the circuit substrate 26 has a warp or an undulation so that each of the electrodes 27 of the circuit substrate 26 has height irregularity, the bumps 6 can be connected to the electrodes 27 with high reliability when the apex portion of each of the bumps 6 of the semiconductor device SM is transformed so that the height of the apex portion of each of the bumps 6 of the semiconductor device SM is adapted to the height of corresponding one of the electrodes 27 of the circuit substrate 26.

Figure 14:
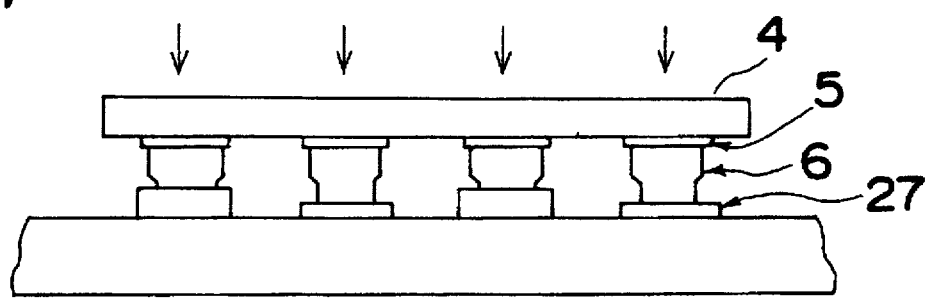
FIG. 14 is a side view of an assembly composed of the semiconductor device and the circuit substrate illustrating such a state that the height of each of the bumps of the semiconductor device is adapted to the height of corresponding one of the electrodes of the circuit substrate.

Consequently, in the third embodiment, there is not performed a flattening step for flattening the bumps 6 by means of the flat plate 14, the step being generally used in the conventional method. However, as shown in FIG. 14, in a step of joining the semiconductor device SM to the circuit substrate 26, the semiconductor device SM held with attractive (suction) force by a not-shown semiconductor device attracting nozzle is disposed in such a manner that each of the bumps 6 is located at a position in response with corresponding one of the electrodes 27 of the circuit substrate 26 to which the semiconductor device SM is joined, the circuit substrate 26 having been already positioned, and then the semiconductor device SM is pressed against the circuit substrate 26 by applying a load of about 50 g/bump using an AC servomotor or an air cylinder. In consequence, the bumps 6 are transformed so that the height of each of the bumps 6 is adapted to the height of corresponding one of the electrodes 27 of the circuit substrate 26. Hereupon, it is preferable that the strength of the pressing force and the applying time of the pressing force are changed in response with the shape and size of the electrodes 27, the quality of the material of the bumps 6 and the shape and size of the bumps 6.

Figure 15:
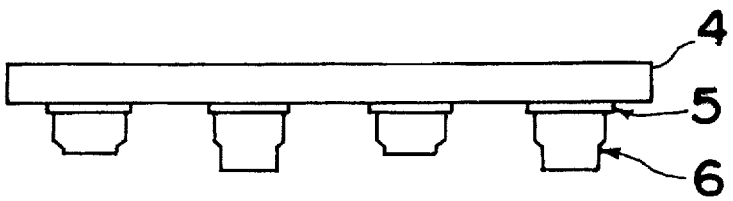
FIG. 15 is a side view of the semiconductor device in which the height of each of the bumps is corrected.

Thus, as shown in FIG. 15, the semiconductor device SM in which the height of each of the bumps 6 is adapted in response with height irregularity of the electrodes 27 of the circuit substrate 17.

Hereupon, the semiconductor device SM may be heated when the semiconductor device SM is pressed against the circuit substrate 26. When the semiconductor device SM is heated to about 300° C., the pressing load is reduced to ½ thereof and also the applying time of the pressing load is reduced. It is preferable that the temperature is changed in response with the shape and size of the electrodes 27, the quality of the material of the bumps 6 and the shape and size of the bumps 6.

Hereinafter, a concrete method of joining the semiconductor device SM to the circuit substrate 26 will be described with reference to FIGS. 16 to 18.

Figure 16:
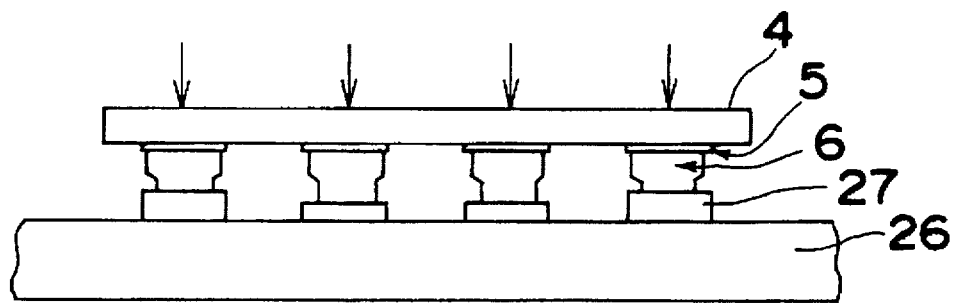
FIG. 16 is a side view of the assembly composed of the semiconductor device and the circuit substrate illustrating such a state that the height of each of the bumps of the semiconductor device is adapted to the height of corresponding one of the electrodes of the circuit substrate.

As shown in FIG. 16, the semiconductor device SM held with attractive force by the not-shown semiconductor device attracting nozzle is disposed in such a manner that each of the bumps 6 is located at a position in response with corresponding one of the electrodes 27 of the circuit substrate 26 to which the semiconductor device SM is joined, the circuit substrate 26 having been already positioned, and then the semiconductor device SM is pressed against the circuit substrate 26 by applying load of about 50 g/bump using the AC servomotor or the air cylinder. In consequence, the bumps 6 are transformed so that the height of each of the bumps 6 is adapted to the height of corresponding one of the electrodes 27 of the circuit substrate 26.

Figure 17:
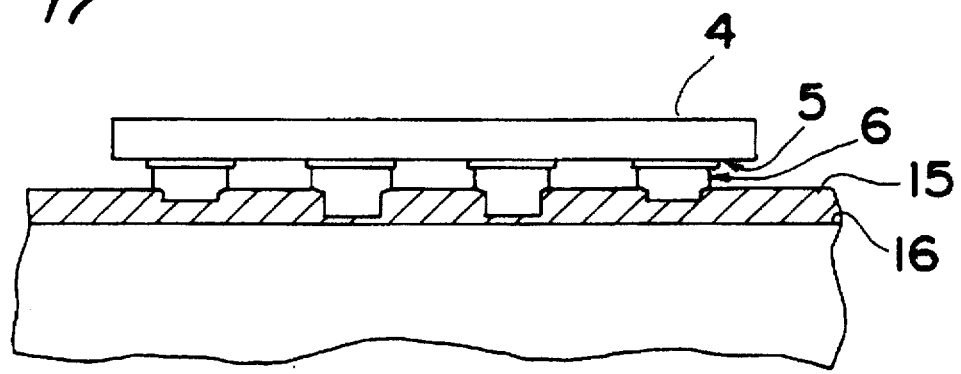
FIG. 17 is a side view of the semiconductor device according to the present invention, which is pushed against an electrically conductive adhesive applied on a surface of a flat plate so as to transfer the electrically conductive adhesive to an apex portion of each of the bumps.

Further, as shown in FIG. 17, the apex portions of the bumps 6 of the semiconductor device SM, the height of each of the bumps 6 being adapted to the height of corresponding one of the electrodes 27 of the circuit substrate 26, are pushed against a flat surface of electrically conductive adhesive 15 or cream-type solder applied on a flat plate surface 16 so that the electrically conductive adhesive 15 or the cream-type solder is transferred to the apex portions of the bumps 6.

Figure 18:
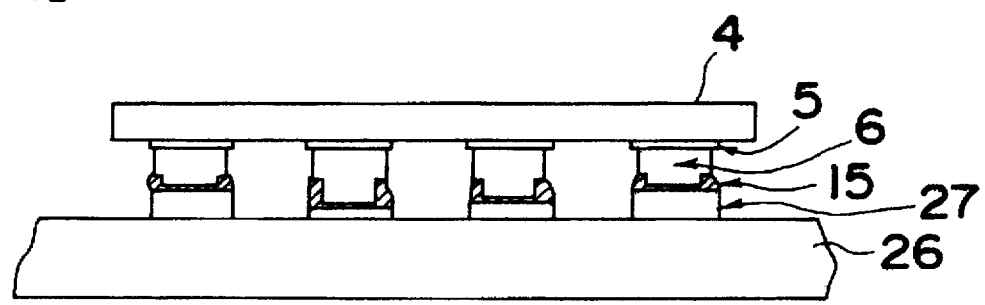
FIG. 18 is a side view of an assembly composed of the semiconductor device and the circuit substrate to which the semiconductor device is joined.
Figure 19:
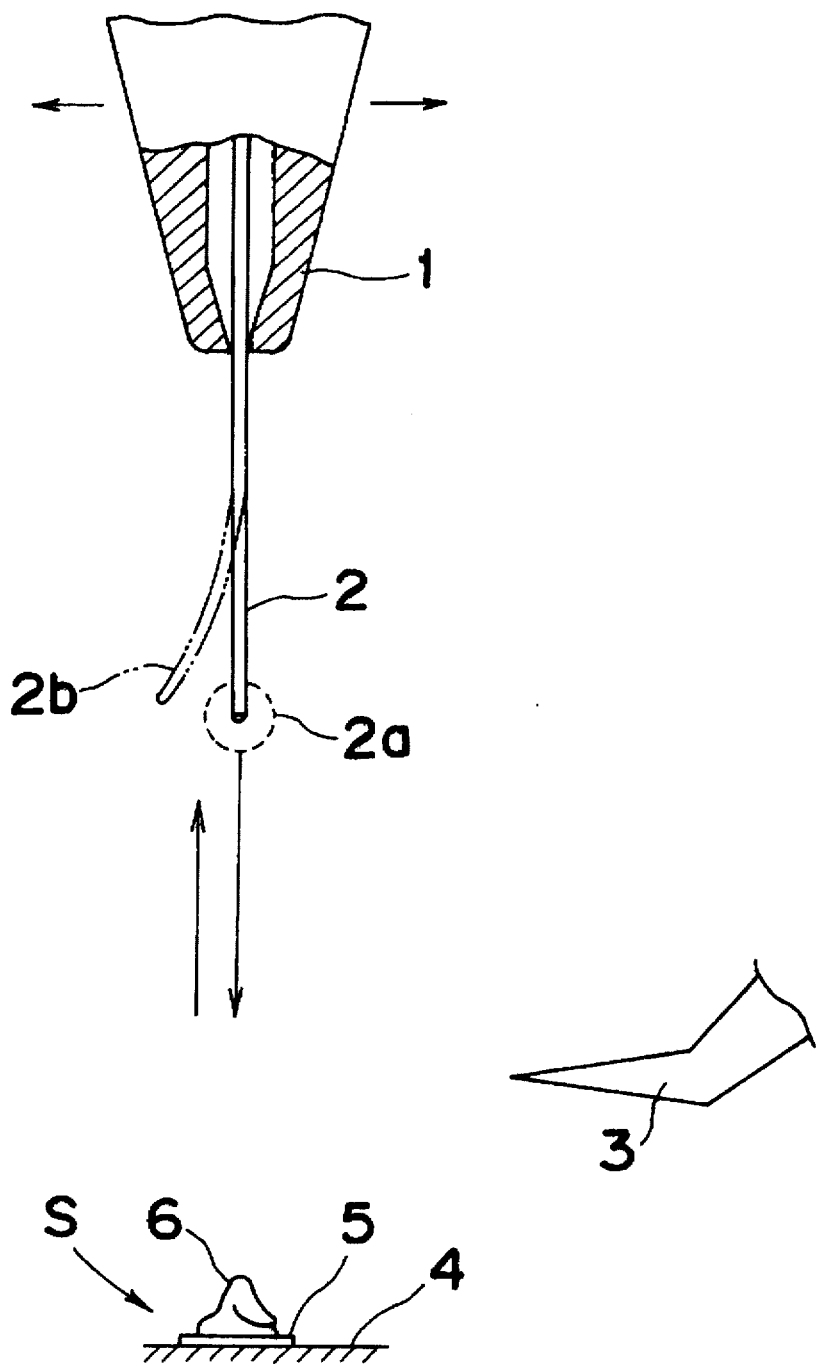
FIG. 19 is a partially sectional side view of an assembly composed of a conventional semiconductor device and a conventional apparatus for forming bumps in a bump forming step.
Figure 20:
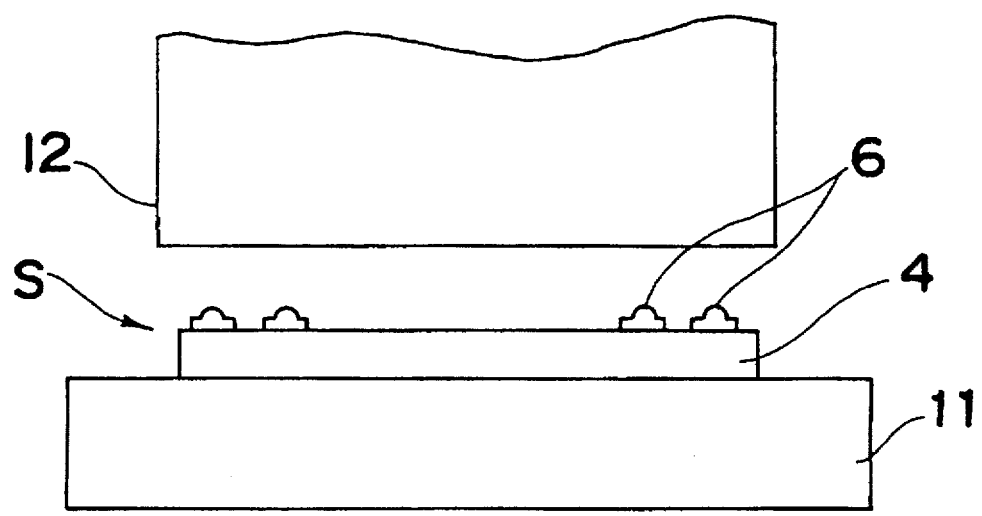
FIG. 20 is a side view of an assembly composed of the conventional semiconductor device and a conventional leveling treatment apparatus for performing a leveling treatment to the semiconductor device.
Figure 21:
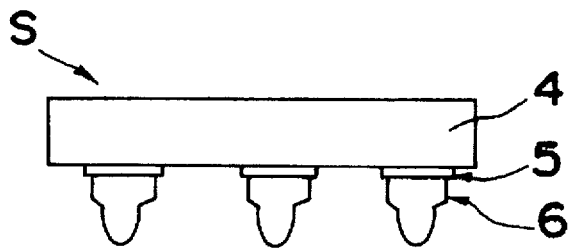
FIG. 21 is a side view of the conventional semiconductor device with the bumps.
Figure 22:
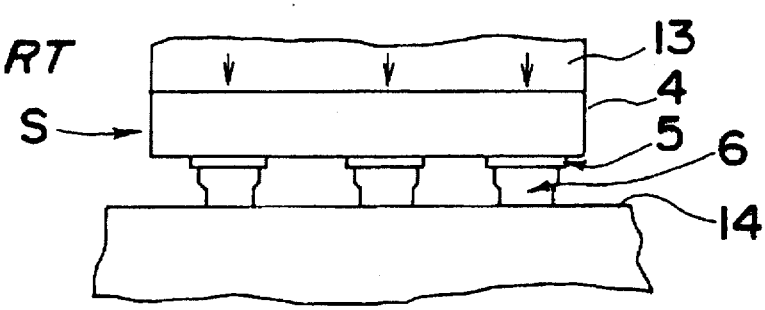
FIG. 22 is a side view of an assembly composed of the conventional semiconductor device and a conventional apparatus for flattening the bumps of the semiconductor device.
Figure 23:
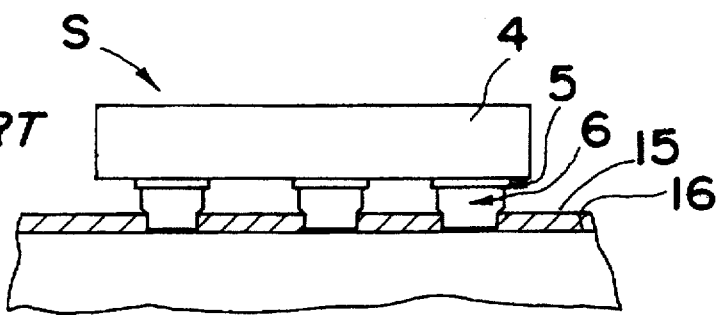
FIG. 23 is a side view of the conventional semiconductor device, which is pushed against an electrically conductive adhesive applied on a surface of a flat plate so as to transfer the electrically conductive adhesive to an apex portion of each of the bumps.
Figure 24:
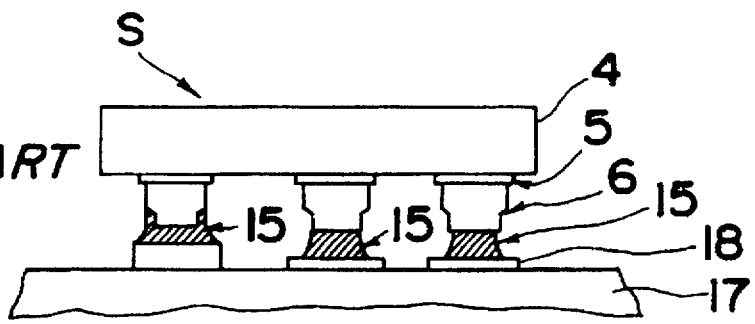
FIG. 24 is a side view of an assembly composed of the conventional semiconductor device and a conventional circuit substrate to which the semiconductor device is joined.

Then, as shown in FIG. 18, the semiconductor device SM, in which the electrically conductive adhesive 15 or the cream-type solder has been transferred onto the apex portions of the bumps 6, is positioned in such a manner that each of the bumps 6 is located on corresponding one of electrodes 27 of the circuit substrate 26, so as to be joined to the circuit substrate 26. Further, the circuit substrate 26 to which the semiconductor device SM is joined, is heated for a required period so as to be preliminarily hardened. After the preliminary hardening process, the circuit substrate 26 is sent to the next step so as to be heated by a heating furnace, and thus the joining process is completed.

Thus, since the bumps 6 of the semiconductor device SM is pressed onto the electrodes 27 of the circuit substrate 26 to which the semiconductor device SM is joined so that the contacting state between the bumps 6 and the electrodes 27 is adapted and then the semiconductor device SM is joined to the circuit substrate 26, the bumps 6 of the semiconductor device SM can closely contact to the electrodes 27 of the circuit substrate 26. In consequence, the joining strength between the semiconductor device SM and the circuit substrate 26 may be improved, and also the connecting resistance value is stabilized in a range of 20 to 30 mΩ.

Although the present invention has been described in terms of preferred embodiments, it will be apparent to those of skill in the art that numerous variations and modifications may be made without departing from the true spirit and scope thereof, as set forth in the following claims.

What is claimed is:

1. A manufacturing method of a semiconductor device including the step of forming a bump on an electrode terminal disposed on a surface of a semiconductor chip using a gold wire as a material of said bump, said gold wire being supplied through a capillary, said electrode terminal having a square shape in plane view, and said bump forming step comprising the steps of:

joining a gold ball onto said electrode terminal, said gold ball being formed by melting an end portion of said gold wire; and moving said capillary in a direction of a diagonal line of said square electrode terminal so as to separate a main portion of said gold wire from said gold ball.

2. A manufacturing method of a semiconductor device including the step of forming a bump on each of first and second electrode terminals disposed on a surface of a semiconductor chip using a gold wire as a material of said bump, said gold wire being supplied through a capillary, and said bump forming step comprising the steps of:

joining a gold ball onto said first electrode terminal located directly under said capillary so as to form a first bump, said gold ball being formed by melting an end portion of said gold wire under a spark condition sufficient to melt said end portion of said gold wire;

moving a holding pedestal holding said semiconductor chip so as to dispose said second electrode terminal directly under said capillary; and joining another gold ball onto said second electrode terminal so as to form a second bump, said gold ball being formed by melting said end portion of said gold wire under a spark condition as same as said spark condition of said first bump.

3. A manufacturing method of a semiconductor device including the step of forming a bump on each of first and second electrode terminals disposed on a surface of a semiconductor chip using a gold wire as a material of said bump, said gold wire being supplied through a capillary, and said bump forming step comprising the steps of:

joining a gold ball onto said first electrode terminal located directly under said capillary so as to form a first bump, said gold ball being formed by melting an end portion of said gold wire using a torch electrode to provide a spark condition sufficient to melt said end portion of said gold wire; and moving said torch electrode around said capillary so as to enable to melt said end portion of said gold wire under a spark condition as same as said spark condition of said first bump, and then joining another gold ball onto said second electrode terminal so as to form a second bump, said gold ball being formed by melting said end portion of said gold wire under said spark condition.

4. A manufacturing method of a semiconductor device comprising:

holding a semiconductor chip having a plurality of bumps on a surface thereof at another surface opposite to said surface by means of a semiconductor holder; and pressing each of said bumps against a corresponding one of electrodes for functional testing on a leveling stage for uniformity of height of each of said bumps, each of said electrodes being divided into two portions which are spaced apart from each other, and simultaneously performing a functional test of said semiconductor chip.

5. The manufacturing method recited in claim 4, wherein said functional test of said semiconductor chip is performed by means of an electrode for functional test use which is provided at a portion of said leveling stage, said portion being contacted to one of said bumps.

6. The manufacturing method recited in claim 4, wherein at least one of said semiconductor holder and said leveling stage is heated when said bumps are pressed against said leveling stage.

7. A manufacturing method of a semiconductor device which is joined to a circuit substrate in such a manner that a bump disposed on each of electrode terminals provided on said semiconductor device is connected to corresponding one of electrodes of said circuit substrate in which an electrical circuit is formed, said manufacturing method comprising the steps of:

positioning said semiconductor device in relation to said circuit substrate in such a manner that each of said bumps is located above corresponding one of said electrodes of said circuit substrate respectively; and pressing said semiconductor device against said circuit substrate so as to transform an apex portion of each of said bumps, and thus adapting height of each of said bumps to actual height of corresponding one of said electrodes of said circuit substrate.

8. The manufacturing method recited in claim 7, wherein a functional test of an electrical circuit in said semiconductor device is performed when said semiconductor device is pressed against said circuit substrate.

9. The manufacturing method recited in claim 7, wherein said semiconductor device is heated when said semiconductor device is pressed against said circuit substrate.

10. A method of joining a semiconductor device to a circuit substrate in such a manner that a bump disposed on each of electrode terminals provided on said semiconductor device is connected to corresponding one of electrodes of said circuit substrate in which an electrical circuit is formed, said method comprising the steps of:

positioning said semiconductor device in relation to said circuit substrate in such a manner that each of said bumps is located above corresponding one of said electrodes of said circuit substrate respectively;

pressing said semiconductor device against said circuit substrate so as to transform an apex portion of each of said bumps, and thus adapting height of each of said bumps to actual height of corresponding one of said electrodes of said circuit substrate;

pushing said bumps of said semiconductor device against a surface of an electrically conductive adhesive or a cream-type solder applied on a surface of a flat plate so as to transfer said electrically conductive adhesive or said cream-type solder to said bumps; and positioning said semiconductor device in relation to said circuit substrate in such a manner that each of said bumps to which said electrically conductive adhesive or said cream-type solder is transferred, is disposed on corresponding one of said electrodes of said circuit substrate respectively, so as to join said semiconductor device to said circuit substrate.

11. The method recited in claim 10, wherein a functional test of an electrical circuit in said semiconductor device is performed when said semiconductor device is pressed against said circuit substrate.

12. The method recited in claim 10, wherein said semiconductor device is heated when said semiconductor device is pressed against said circuit substrate.

* * * * *